July 29, 1969 J. KOSTER ET AL 3,458,818

CIRCUIT ARRANGEMENT FOR THE AUTOMATIC GAIN CONTROL
OF AN ELECTRIC SIGNAL
Filed Oct. 19, 1966

INVENTORS
JOHAN KOSTER
HERMAN J. G. M. BENNING
BY
Frank R. Trifari
AGENT

United States Patent Office 3,458,818
Patented July 29, 1969

3,458,818

CIRCUIT ARRANGEMENT FOR THE AUTOMATIC GAIN CONTROL OF AN ELECTRIC SIGNAL

Johan Koster and Herman Jozef Gerardus Maria Benning, Emmasingel, Eindhoven, Netherlands, assignors, by mesne assignments, to U.S. Philips Corporation, New York, N.Y., a corporation of Delaware Filed Oct. 19, 1966, Ser. No. 587,844
Claims priority, application Netherlands, Oct. 28, 1965, 6513948
Int. Cl. H04b 1/16
U.S. Cl. 325—414 9 Claims

ABSTRACT OF THE DISCLOSURE

An automatic gain control circuit in which input signals are applied to an output circuit by way of two parallel branches. The signals are applied to the branches in phase opposition. One of the paths contains a voltage variable impedance, such as a diode, to vary the amount of signal cancellation at the output circuit. The control circuit increases the loading of the input circuit as the signal amplitude increases.

The invention relates to a circuit arrangement for the automatic gain control of an electric signal in which this signal is applied to an input circuit from which are derived a first signal voltage supplied to a first transmission path and a second signal voltage which is in phase opposition to the first signal voltage and which is supplied to a second transmission path including a variable impedance element, the variable impedance element being controlled by a control quantity varying with the signal amplitude and the two signals conducted through the transmission paths being joined in a common output so that with high signal amplitudes these two signals substantially compensate each other in the common output.

For the use of automatic gain control, for example, in radio or television receivers, it is known to employ a so-called bridge-circuit arrangement. In this circuit arrangement, two signal voltages of opposite phases are derived from the input signal and are applied through two transmission paths to the subsequent amplifier stage. One transmission path includes a diode the impedance of which is controlled by a control quantity, while a small capacitor is included in the other transmission path. With low signal amplitudes, the diode is conducting and the signal transmission is mainly effected through this diode. With increasing signal amplitudes, the diode is driven gradually further in the blocking direction, while with very high input signals the blocked diode constitutes a mainly capacitative impedance; this impedance constitutes together with the capacitor and the other transmission path a bridge circuit which is substantially in the state of equilibrium so that the signal transmission is considerably attenuated.

A great advantage of such controllable bridge circuits is the very wide control range, since the attenuation resulting from the state of equilibrium of the bridge circuit is practically unlimited.

Another kind of circuit for automatic gain control consists of a parallel resonant circuit which is included in the transmission path of the signal and across which a so-called damping diode is A.C.-connected in parallel arrangement; the impedance of this damping diode is controlled by the control quantity in a sense such that with low signals the impedance of the diode is high so that the resonant circuit has a high quality and a great selectivity and the signals are hardly attenuated. With increasing signal amplitude, the impedance of the diode decreases so that the circuit is damped and the transmitted signals are attenuated. An important advantage of such automatic gain control circuit arangements including a damping diode is that in contrast with the aforementioned bridge circuit the input impedance of the circuit arrangement decreases with increasing signal. This is of importance if the circuit arrangement is included in the collector circuit of a preceding transistor. The increase with increasing signal amplitude collector alternating current of this transistor produces a collector alternating voltage across the input impedance of the automatic gain control circuit which in case of a constant input impedance would proportionally increase, which would already soon result in overexcitation of the collector space of this transistor. In an automatic gain control circuit having a damping diode, the input impedance of this circuit decreases with increasing signal amplitude so that the alternating voltage at the collector electrode of the preceding transistor increases considerably less rapidly. In these circuit arrangements, overexcitation of the collector space therefore occurs only with considerably higher signal amplitudes.

Another advantage of automatic gain control circuits having a damping diode is that with increasing input signal the quality of the resonant circuit decreases so that the passed bandwidth increases. With the reception of strong transmitters, the bandwidth of the receiver is therefore automatically enlarged.

The object of the invention is to provide a circuit arrangement for automatic gain control which has both the wide control range of a controllable bridge circuit and the advantages of a circuit arrangement having a damping diode, viz, the capability of processing high signals without the occurrence of distortions and the automatic bandwidth control. The circuit arrangement in accordance with the invention is characterized in that the first signal transmission path includes a mainly ohmic impedance and in that the impedance of the variable impedance element is controlled so that it decreases with increasing signal amplitude, while the second signal voltage exceeds the first signal voltage by an amount such that the input circuit is subjected to a damping which considerably increases with the progress of the control.

It should be noted that it is known per se in a bridge circuit in which signal voltages of the same amplitude are supplied to the two transmission paths to cause the impedance of the variable resistance element included in the second transmission path to decrease with increasing signal amplitude. However, in this circuit arrangement the damping of the input circuit, which only slightly increases with the progress of the control, is compensated for by a second variable resistance element controlled in opposite sense by the control quantity and included in the first signal transmission path.

The invention will now be described more fully with reference to the figures shown in the drawing, of which:

FIG. 1 shows an automatic gain control circuit for use in the intermediate frequency portion of a radio receiver. The circuit arrangement is preceded by a mixer transistor 1 which supplies an intermediate-frequency signal which may consist, for example, of a carrier wave of 460 kc./s. amplitude-modulated by a signal.

Figure 1:
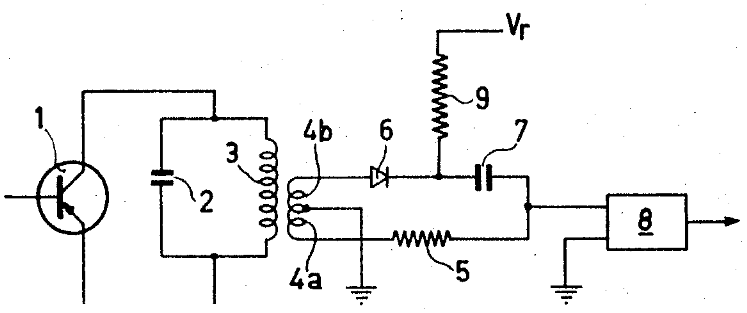
FIG. 1 shows a basic circuit diagram of an automatic gain control circuit which serves to explain the invention.

A resonant circuit included in the collector circuit of this mixer transistor and constituted by a capacitor 2 and an inductor 3 is tuned to the carrier frequency of the signal. The signal is derived by means of a coupling winding consisting of two parts *4a* and *4b* to one end of which is connected a first signal transmission path including a resistor 5, while the other end of this coupling winding has connected to it a second signal transmission path including a diode 6 and a blocking capacitor 7. The two signal transmission paths are connected to each other in a common output which is connected to the input terminal of a subsequent amplifier stage 8. The other input terminal of this amplifier stage and the centre tapping on the coupling winding are connected to earth.

The impedance of the diode 6 is controlled with the aid of a control voltage V*r* supplied to this diode through a resistor 9; the blocking capacitor 7 serves to prevent the control voltage from flowing away to earth through the input of the amplifier 8 or the resistor 5.

In circuit arrangements for automatic gain control, the control voltage V*r* varies with the amplitude of the signal supplied by the circuit arrangement and it may be derived, for example, in a maner known per se from the output of the amplifier stage 8. The control voltage is chosen so that with low signal amplitudes the diode is blocked, while with increasing signal amplitude this diode is driven gradually further in the pass direction. With low signal amplitudes, therefore only the first transmission path including the resistor 5 is pervious to the signal and the signal is transmitted through this path to the input of the amplifier stage 8. The transformation ratio $n_p/n_a$ between the primary inductor 3 and the lower half 4*a* of the coupling winding acting as secondary winding is chosen so that optimum signal transmission is effected without the input impedance of the amplifier stage 8 being permitted to exert an excessively great influence on the quality and the tuning frequency of the resonant circuit 3, 4. In practice, the transformation ratio $n_p/n_a$ may be chosen, for example, to be equal to 30.

With increasing signal amplitude, the impedance of the diode 6 is reduced with the aid of the control voltage V*r* so that signal transmission is likewise effected through the second emission path to the input of the amplifier 8. However, this signal is in phase opposition to the signal applied through the first transmission path so that according as the diode 6 becomes more conducting, a greater part of the signal applied through the first transmission path is compensated for by the signal applied through the second transmission path so that attenuation of the signal is achieved. The signal attenuation of the circuit arrangement is very great as soon as the resistance of the diode 6 has been made substantially equal to that of the resistor 5 with the aid of the control voltage V*r*; the bridge circuit constituted by the two halves of the coupling winding, the diode 6 and the resistor 5 is then substantially in the state of equilibrium and the amplitude of the output signal of the circuit arrangement applied to the amplifier 8 is only very low with respect to that of the input signal applied to the input circuit.

Since the impedance of the diode 6 decreases with increasing signal amplitude, the damping of the resonant circuit 2, 3 increases with increasing signal amplitude; this is of importane, since, as stated in the preamble, distortion in the preceding transistor 1 is thus avoided, while moreover an automatic bandwidth control is carried out and the control range is additionally widened.

The extent of this increase in damping can be calculated as follows:

In the non-controlled state, when the diode 6 is blocked, the damping exerted on the primary circuit by the secondary circuit is negligible with respect to the resonance resistance of the primary circuit itself which in practice may be 10KΩ.

In the completely controlled state, the resistance $R_6$ of the diode 6 is equal to the resistance $R_5$. For example, the resistance $R_5$ may be 100Ω so that in the controlled state a resistance $R_5+R_6=2R_5=200\Omega$ is connected across the coupling winding. If, as assumed above, the transformation ratio between the primary winding 3 and one half of the coupling winding is equal to 30, the transformation ratio between the primary winding and the whole coupling winding is equal to 15 so that the damping resistance transformed via this transformer to the primary side is $(15)^2.200\Omega=45K\Omega$.

It follows this numerical example that in the circuit arrangement of FIG. 1, there exists hardly a damping increasing with the progress of the control. In the non-controlled state, the resonance resistance of the circuit 2, 3 is equal to 10KΩ and in the completely controlled state, an additional damping resistance of 45KΩ is connected in parallel therewith so that the overall resonance resistance has decreased only to approximately 8.2KΩ.

Figure 2:
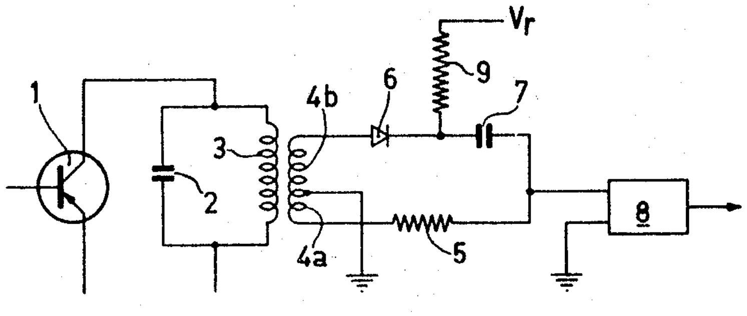
FIG. 2 shows a basic circuit diagram of a circuit arrangement in accordance with the invention.

In order to obtain an improvement in this respect, according to the invention, the part (4*b*) of the coupling winding to which the second signal transmission path is connected is strongly enlarged with respect to the part (4*a*) to which the first signal transmission path is connected. The coupling winding is thus rendered very asymmetrical so that a much greater signal voltage is supplied to the second transmission path (the diode 6) than to the first transmission path (the resistor 5). This is illustrated in FIG. 2.

The ratio between the members of turns $n_p$, $n_b$ and $n_a$ of the primary winding 3, and the secondary winding-parts 4*b* and 4*a*, respectively, may be, for example, 30:8:1. It should be noted that with low signal amplitudes, when the diode 6 is blocked, only the part 4*a* of the coupling winding is operative for the signal transmission and this signal is transmitted with the same transformation ratio $n_p:n_1=30:1$ as in the circuit arrangement of FIG. 1, which ratio is the optimum for low signal amplitudes. The enlargement of the winding part 4*b* therefore does not at all adversely affect the properties of the circuit arrangement to transmit low signals.

The final state of the control is attained when the signal applied through the resistor 5 is substantially completely compensated for by the signal applied in phase opposition through the diode 6. Since the signal voltage supplied to the diode 6 is considerably ($n_b/n_a$ times) higher than the signal voltage supplied to the resistor 5, this condition is already attained when the resistance $R_6$ of the diode is substantially equal to $$\frac{n_b}{n_a}R_5$$

In the first place the advantage is then obtained that the control of the diode 6 requires a considerably smaller quantity of control energy than in the circuit arrangement of FIG. 1, since the diode need be controlled much less far in the pass direction, while the second advantage consists in that the resistor 5 may be chosen to be smaller (for example, 33Ω instead of 100Ω), which results, as will be proved below, in that the damping of the input circuit increasing with the control further increases.

This damping can be determined as follows:

The series-combination of the diode 6 and the resistor 5 is connected across the whole coupling winding; since in the controlled state the resistance of the diode is $$\frac{n_b}{n_a}R_5$$

the overall resistance across the coupling winding is:

$$\left(\frac{1+n_b}{n_a}\right)R_5=\left(\frac{n_a+n_b}{n_a}\right)R_5$$

The transformer ratio between the primary winding 3 and the whole coupling winding is equal to $$\frac{n_p}{n_a+n_b}$$

and the damping resistance transformed to the primary side is therefore equal to $$\left(\frac{n_p}{n_a+n_b}\right)^2\cdot\frac{n_a+n_b}{n_a}R_5=\frac{n_p^2}{n_a(n_a+n_b)}R_5=\left(\frac{n_p}{n_a}\right)^2\cdot\frac{1}{1+n_b/n_a}R_5$$

It is clearly apparent from this formula that the enlargement of the part 4*b* of the coupling winding results in a considerable increase in the damping of the primary circuit. This is both directly due to the increase of the number of turns $n_b$ of the part 4*b*, and indirectly since the resistance $R_5$ can consequently be reduced.

As was shown above, in the circuit arrangement of FIG. 1 in which $n_p:n_b:n_a=30:1:1$ and $R_5=100\Omega$, in the controlled state the transformed damping resistance is equal to 45KΩ. In the circuit arrangement of FIG. 2 in which $n_p:n_b:n_a=30:8:1$ and $R_5=33\Omega$, in the controlled state the transformed damping resistance is 3300Ω.

The two signal voltages supplied to the two transmission paths may be derived from the input circuit in different ways. Instead of a coupling winding consisting of two parts, as shown in FIG. 2, there may be used two separate coupling windings not D.C.-connected to each other, the winding for the second transmission path being considerably larger than that for the first transmission path.

Figure 3:
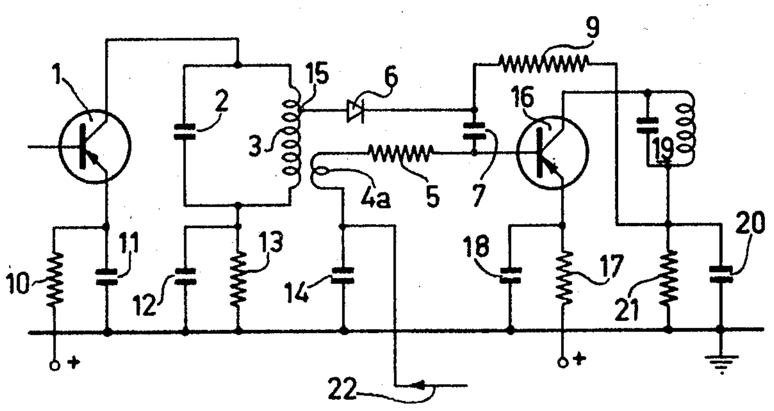
FIG. 3 shows a further developed embodiment of a circuit arrangement in accordance with the invention.

Alternatively, the inductor 3 or the capacitance 2 of the resonant circuit may be subdivided into a plurality of inductive or capacitative sections to which the two transmission paths are connected so that the two signal voltages are in phase opposition to each other with respect to earth and the signal voltage supplied to the second transmission path is materially higher than the signal voltage supplied to the first transmission path. It should further be noted that the input circuit may be of an aperiodical type instead of being constituted by a resonant circuit. A considerable simplification of the circuit arrangement is obtained if the coupling winding to which the second transmission path is connected is combined with at least one part of the primary inductance; the first transmission path is connected to a separate coupling winding. A further developed embodiment thereof is shown in FIG. 3. Circuit elements corresponding with those of FIG. 2 are denoted by the same reference numerals.

In the circuit arrangement of FIG. 3, the emitter circuit of the transistor 1 includes a resistor 10 connected to a positive direct voltage and decoupled for the signal frequency by means of a capacitor 11. This resistor is used for the direct-current supply of the transistor 1. The collector circuit of this transistor includes in series with the resonant circuit 2, 3 a resistor 13 decoupled by means of a capacitor 12. The purpose for which this resistor is used will be set out hereinafter. With the aid of the coupling winding **4*a*, the signal voltage for the first transmission path including the resistor 5 is derived. The lower part of this coupling winding is earthed for the signal frequencies with the aid of a capacitor 14. The signal voltage for the second transmission path including the diode 6 and the coupling capacitor 7 is derived from the inductor 3 with the aid of a tapping 15 on this inductor so that the part of the inductor between the tapping 15 and the end earthed by means of the capacitor 12 acts as coupling winding for the second signal transmission path. Thus, an additional coupling winding for the second transmission path (of, the winding 4*b*** in FIG. 2) is economized.

The two signal transmission paths, viz the first signal transmission path including the resistor 5 and the second signal transmission path including the diode 6 and the coupling capacitor 7, are both connected to the base electrode of an amplifier transistor 16. The winding **4*a* is wound so that the signal voltage supplied to the resistor 5 is in phase opposition to the signal voltage at the tapping 15. The emitter circuit of the transistor 16 includes an emitter resistor 17 which is connected to a positive direct voltage and which is decoupled by a capacitor 18. The collector circuit of the transistor 16 includes a resonant circuit 19 tuned to the signal frequencies with the aid of which the signal is coupled out (in a manner not shown) and a resistor 21 connected in series therewith and decoupled by a capacitor 20. The upper part of this resistor is connected through the resistor 9 to the junction of the diode 6 and the coupling capacitor 7**.

An automatic gain control voltage is supplied through a conductor 22 to the lower part of the coupling winding **4*a*, which voltage may be derived, for example, by rectification from the output signal of the transistor 16**. The automatic gain control is effected in the following manner.

In case of reception of low signals, such a control voltage is supplied through the conductor 22, the coupling winding **4*a* and the resistor 5 to the base electrode of the transistor 16 that a comparatively high emitter-collector direct current flows through this transistor so that this transistor is adjusted to maximum amplification. The high collector direct current of the transistor 16 also flows through the circuit 19 and the resistor 21 so that a high positive voltage is produced across this resistor which is supplied through the resistor 9 to the cathode of the diode 6**.

A direct current which is independent of the automatic gain control likewise flows through the emitter-collector circuit of the transistor 1, the inductor 3 and the resistor 13. This direct current produces across the resistor 13 a positive direct voltage which is applied through the inductor 3 to the anode of the diode 6. The circuit arrangement is proportioned so that with low signal amplitudes the positive direct voltage across the resistor 21 is higher than that across the resistor 13 so that the diode 6 is blocked and the signal transmission is effected substantially exclusively through the first signal transmission path.

With increasing signal amplitude, the transistor 16 is controlled in the reverse direction in known manner by tht control voltage supplied via the conductor 22 so that the amplification of this transistor decreases while the direct voltage across the resistor 21 also decreases. Accordingly as this direct voltage decreases as far as below the value of the direct voltage produced across the resistor 13, the diode 6 is driven gradually further in the pass direction so that the bridge circuit constituted by the elements **3, 4*a*, 5, 6 and 7 reaches the state of equilibrium. Thus, a considerable reduction of amplification is attained while moreover the resonant circuit 2, 3** is damped materially.

What is claimed is:

1. An automatic gain control circuit comprising a source of intelligence signals, an input circuit, a first output terminal, first and second signal transmission paths having their output ends connected to said terminal, said input circuit comprising means for applying said intelligence signals to the input ends of said first and second paths in opposite phases respectively, said first path being composed only of fixed impedance means including first series impedance means, means for decreasing the impedance of the second path with increases in the amplitude of said intelligence signals comprising a variable series impedance means responsive to a control signal applied thereto, a source of a control signal responsive to the amplitude of said intelligence signals, and means for applying said control signal to said second path, whereby the damping of said input circuit by said variable impedance means thereby increases.

2. An automatic gain control circuit as defined in claim 1 further comprising a second output terminal coupled to a reference potential and means for coupling said input circuit to said reference potential.

3. An automatic gain control circuit comprising a source of signals, an input circuit, an output terminal, first and second signal transmission paths having their output ends connected to said terminal, said input circuit comprising means applying said signals to said first transmission path with a first phase and means applying said signal to said second transmission path with the opposite phase and with an amplitude greater than the amplitude of signals applied to said first path, whereby the signals applied to said terminal by way of said first and second paths have opposite phases, said first path being composed only of fixed impedance means, and including a first series resistor, said second path including a variable series resistor means having a voltage-dependent resistance, a source of a control voltage responsive to the amplitude of said signal, and means for applying said control voltage to said variable series resistor means whereby the resistance of said resistor decreases with increases in said signal amplitude and the damping of said input circuit by said variable resistor means thereby increases.

4. The gain control circuit of claim 3 in which said input circuit comprises a parallel resonant circuit of inductance means and capacitor means tuned to the frequency of said signals, comprising first and second windings magnetically coupled to said inductance means for applying said signals to said first and second path, said second winding having a substantially greater number of turns than said first winding.

5. The gain control of claim 4 in which one end of each of said first and second windings is connected to a point of reference potential, said second path comprising said variable resistor means and a capacitor serially connected between the other end of said second winding and said terminal, said first path comprises said first resistor connected directly between the other end of said first winding and said terminal, and said control voltage is applied to the junction of said variable resistor means and said capacitor.

6. The gain control circuit of claim 3 in which said input circuit comprises a parallel resonant circuit of inductance means and capacitor means tuned to the frequency of said signals, comprising a winding magnetically coupled to said inductance means for applying said signals to said first path, and a tap on said inductance means for applying said signals to said second path.

7. The gain control circuit of claim 6 comprising a transistor for applying said signals to said resonant circuit, wherein the collector of said transistor is connected to one point on said resonant circuit, a parallel resistance-capacitance circuit connected between another point on said resonant circuit and a point of reference potential, said second path comprises said variable resistor means and a capacitor connected between said tap and terminal, and means applying said control voltage to the junction of said variable resistor means and said capacitor, whereby collector current of said transistor flowing through said parallel resistor-capacitor circuit provides a bias for said variable resistor means.

8. The gain control circuit of claim 7 comprising a second transistor having its base electrode connected to said terminal, wherein said first path comprises said first series resistor connected directly between one end of said winding and said terminal, and means connecting said source of control voltage to the other end of said winding, whereby the gain of said second transistor is controlled by said control voltage.

9. The gain control circuit of claim 8 comprising an output circuit connected between the collector of said second transistor and a point of reference potential, said output circuit comprising collector resistance means, and said means for applying said control voltage to said junction comprising resistor means for applying the voltage drop across said collector resistor means to said junction.

References Cited

UNITED STATES PATENTS 3,205,444 9/1965 Birkenes ---------- 325—414 X

KATHLEEN H. CLAFFY, Primary Examiner

D. L. RAY, Assistant Examiner